United States Patent
Munekane

(10) Patent No.: US 7,356,900 B2
(45) Date of Patent: Apr. 15, 2008

(54) MANIPULATOR NEEDLE PORTION REPAIRING METHOD

(75) Inventor: Masanao Munekane, Chiba (JP)

(73) Assignee: SII NanoTechnology Inc. (JP)

( * ) Notice: Subject to any disclaimer, the term of this patent is extended or adjusted under 35 U.S.C. 154(b) by 575 days.

(21) Appl. No.: 10/973,796

(22) Filed: Oct. 26, 2004

(65) Prior Publication Data

US 2005/0091815 A1   May 5, 2005

(30) Foreign Application Priority Data

Oct. 27, 2003   (JP)   ............................. 2003-365752
Oct. 26, 2004   (JP)   ............................. 2004-311196

(51) Int. Cl.
*B23P 6/00*     (2006.01)
*B23P 25/00*    (2006.01)
*B23P 13/00*    (2006.01)

(52) U.S. Cl. ................................ 29/402.01; 29/402.09; 29/402.18; 29/458; 29/557; 427/142; 163/5

(58) Field of Classification Search ............. 29/402.01, 29/402.09, 402.11, 402.13, 402.16, 402.18, 29/402.19, 458, 557, 558; 294/99.2; 606/210; 163/5; 427/142
See application file for complete search history.

(56) References Cited

U.S. PATENT DOCUMENTS

| | | | | |
|---|---|---|---|---|
| 4,562,332 A | * | 12/1985 | Walter et al. | 219/121.35 |
| 5,630,268 A | * | 5/1997 | Smith et al. | 29/557 |
| 5,683,547 A | * | 11/1997 | Azuma et al. | 438/695 |
| 2004/0063100 A1 | * | 4/2004 | Wang | 435/6 |

* cited by examiner

*Primary Examiner*—Jermie E. Cozart
(74) *Attorney, Agent, or Firm*—Adams & Wilks

(57) ABSTRACT

In a manipulator needle portion defect repairing method, the existence of an abrasion or a fracture in a needle portion for holding a sample at an end of a manipulator disposed in an FIB device is confirmed using a microscope function of the FIB device. The abrasion or the fracture in the needle portion is then repaired by chemical vapor deposition using a focused ion beam of the FIB device.

16 Claims, 6 Drawing Sheets

FIG. 1A
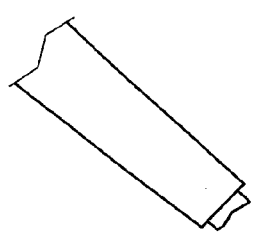
BREAKAGE DEFECT
FIG. 1B
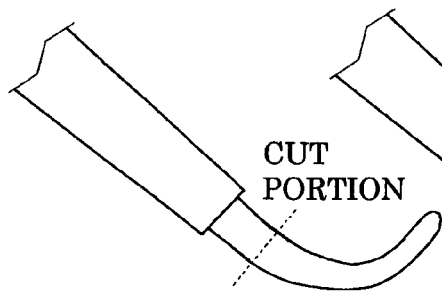
CUT PORTION
BEND DEFECT
FIG. 1C
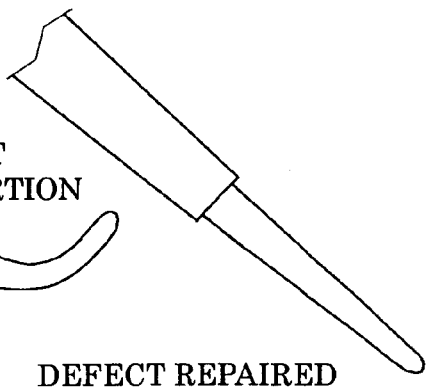
DEFECT REPAIRED
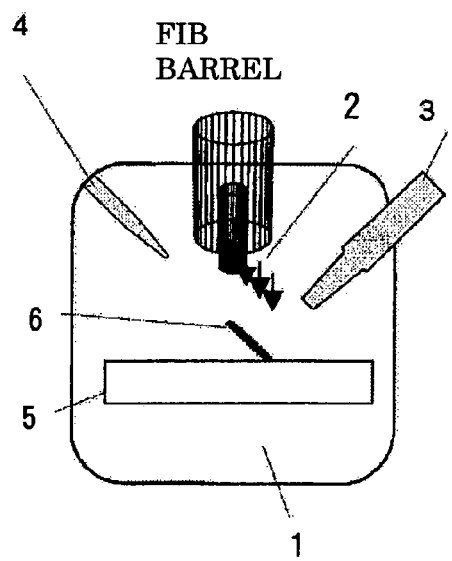
FIB IRRADIATION POSITION IS SHIFTED
FIG. 2A
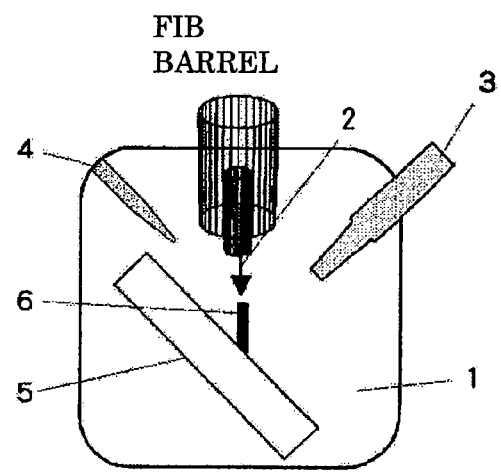
SAMPLE STAGE IS TILTED
FIG. 2B

RESTORED NEEDLE

FIG. 7A PRIOR ART
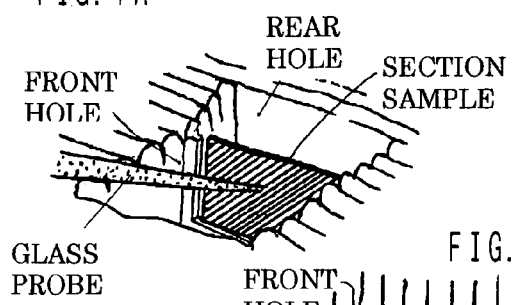
FIG. 7B PRIOR ART
FIG. 7C PRIOR ART
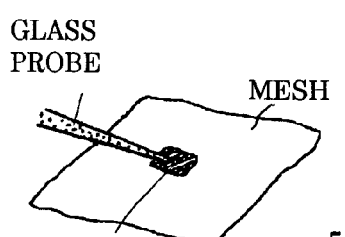
FIG. 7D PRIOR ART
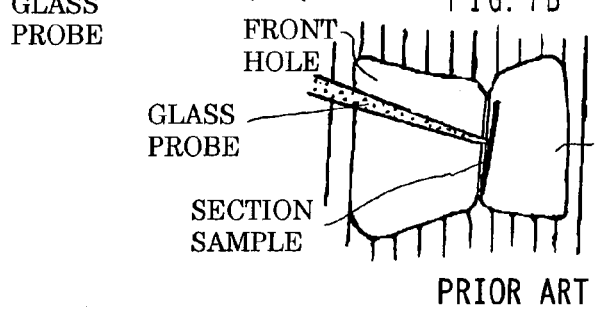
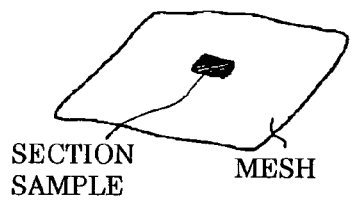
FIG. 8 PRIOR ART
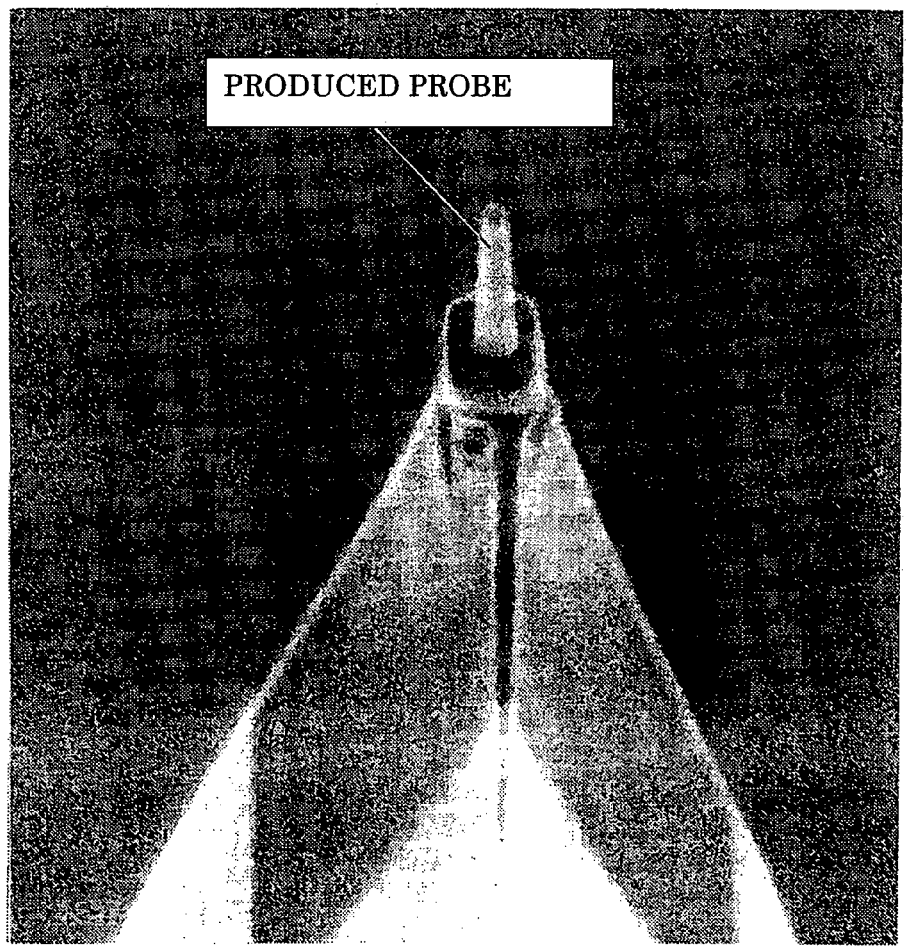

MANIPULATOR NEEDLE PORTION REPAIRING METHOD

BACKGROUND OF THE INVENTION

The present invention relates to a technique for correcting a defect of a tip needle portion of a manipulator for handling a fine sample or a fine structure, which is set in a vacuum chamber of a focused ion beam (FIB) device, using the FIB.

As a method of creating a sample for a transmission electron microscope (TEM), a technique for subjecting a semiconductor wafer to lamination machining using a focused ion beam (FIB) device is known. In order to carry a fine section sample, which is obtained by cutting a sectional portion subjected to the lamination machining, onto a sample stand and hold the fine section sample on the sample stand stably, a micro-manipulator is used. JP-A-2001-141620 proposes a machining method of, as shown in FIGS. 7A to 7D, irradiating a focused ion beam on a wafer sample from a position above a sample surface to etch both sides of an observation section, scanning a sample, which is obtained by tilting the sample surface in a state in which a front hole and a rear hole are drilled and lamination progresses appropriately and subjecting the sample surface to lamination machining, using the focused ion beam to perform cutting for side portions of the sample surface (FIG. 7A), holding a section sample surely using a manipulator (only a glass probe, which is a tip portion of the manipulator, is shown in the figure) after lamination finish machining (FIG. 7B) and transferring and placing the section sample on a mesh (FIG. 7C), and creating a sample for TEM observation stably (FIG. 7D). In the handling for treating a fine piece such as this section sample in the vacuum chamber, a manipulator for enabling drive operation in a fine space and a sharpened needle for grasping the fine section sample are provided. This is a so-called micro-manipulator. Metal such as tungsten W or platinum Pt is used for the needle. However, if the needle is sharpened to about several μmφ, the needle is susceptible to an external shock and is bent at a tip portion thereof when the needle grasps and manipulates a sample. Since it is not easy to repair this needle to be straight, the needle is replaced eventually.

As a technique for forming a needle structure of a submicron order using the FIT device, it is publicly known to form a probe of an atomic force microscope (AFM). The probe of the atomic force microscope (AFM) is provided at a cantilever tip portion. Conventionally, as this probe, a cantilever including the probe at the tip portion is created using a micro-fabrication technique such as lithography and etching with silicon nitride or silicon as a base material, and a probe portion of the cantilever is oxidized and then sharpened by removing an oxide film with etching. However, the probe tip serving as a sensor portion may be required to be sharpened as a probe for the AFM. Therefore, a technique for forming a firm cylindrical chip of a conductive material such as tungsten or DLC (diamond-like carbon) with the CVD using the FIB in the cantilever tip portion is disclosed. FIG. 8 shows a photograph of the chip. The probe formed in this way is structurally thin and high in abrasive resistance and has necessary rigidity. The probe is attached to the cantilever tip and formed such that the chip is perpendicular to a sample surface. In addition, the material has electric conductivity, and the probe has stable resolution and high measurement reproducibility (see, for example, JP-A-2003-240700). In addition, K. L. Lee et al. proposes a deposition chip that is formed by irradiating an electron beam at a tip of a chip of a cantilever in a vacuum chamber of a scanning electron microscope (SEM) and depositing a carbon decomposition product using an electron beam on the irradiated portion (see FIG. 9: an image on the left indicates that a chip is formed at a tip of a probe portion at a cantilever tip and an image on the right is an enlarged image of the probe tip portion) (K. L. Lee et al.: "Submicron Si trench profiling with an electron-beam fabricated atomic force microscope tip" J. Vac. Sci. Technol. B, vol. 9, No. 6, Nov/Dec 3562-3568 (1991)).

In the needle defect correction in the conventional technique, first, work is suspended to release a vacuum state in a chamber, then, the chamber is opened to remove and repair a probe, and the probe is attached again or replaced. This work requires long time and high cost. Moreover, the work continued after the replacement has to be started all over again from creation of a vacuum state. A sample being created is often lost, which causes large temporal loss and work load for an operator.

In the chip forming method using the electron beam deposition, whereas a thin cylindrical chip can be formed, the chip is susceptible to shock and has insufficient strength as a chip for the AFM.

It is an object of the invention to propose a method of correcting a defect, which has occurred in a tip needle portion of a manipulator provided in an FIB device, without consuming time and labor. In addition, it is another object of the invention to propose a technique that, when abrasion or breakage of a probe of a probe microscope or bend or breakage of a micro-manipulator occurs, makes it possible to repair and restore the probe or the micro-manipulator in a vacuum chamber without removing and replacing the probe or the micro-manipulator.

SUMMARY OF THE INVENTION

A restoring method of the invention is adapted to, when abrasion or fracture of a needle portion of a manipulator provided in an FIB device is confirmed by a microscope function of the FIB device, repair a lost structure of the needle portion with CVD using an FIB of the FIB device.

The restoring method of the invention is adapted to, when it is confirmed in a microscope image that the needle portion of the manipulator provided in the FIB device is in a bent state, cut the portion by etching using an FIB and form a normal structure at a tip of the cut portion with the CVD using an FIB to thereby repair the needle portion.

In a manipulator needle portion restoring method of the invention, a defective portion is repaired by a step of planting plural needles for replacement on a substrate in advance and joining a needle portion of a manipulator provided in an FIB device in an abrasion or fracture state to a tip portion of the needle for replacement with the CVD using an FIB and a step of cutting a base of the needle for replacement by etching using an FIB.

In the manipulator needle portion restoring method of the invention, a defective portion is repaired by a step of planting plural needles for replacement on a substrate in advance and cutting a needle portion in a bent state of the manipulator provided in the FIB device with etching using an FIB, a step of joining the cut portion to a tip portion of the needle for replacement with the CVD using an FIB, and a step of cutting a base of the needle for replacement with the etching using an FIB.

A needle member set for replacement of the invention is a needle member set in which plural needles are planted on a substrate in an inclined state with respect to the substrate by FIB machining.

The above description can also be applied to microtweezers in which two sharp needles are arranged side by side in a pair and used. When each of the needles is bent or fractured, it is possible to restore a defective portion with the same method. In addition, when one of the needles of the micro-tweezers is fractured, if lengths at the time of work are sufficient, lengths of the two needles are adjusted to be the same to correct the defect by cutting the other needle with etching.

BRIEF DESCRIPTION OF THE DRAWINGS

In the accompanying drawings:

FIGS. 1A to 1C are diagrams explaining defect examples to be treated by the invention and defect repair;

FIGS. 2A and 2B are diagrams explaining a method of forming an auxiliary needle that is performed in the invention;

FIGS. 7A to 7D are diagrams explaining a TEM sample creation process by an FIB device including a manipulator;

FIG. 8 is a diagram showing an example in which a probe tip portion of an AFM is manufactured by CVD using an FIB.

DETAILED DESCRIPTION OF THE PREFERRED EMBODIMENTS

Figure 3A:
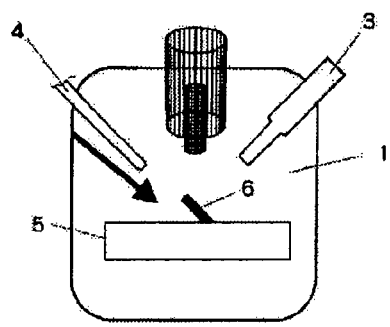
FIGS. 3A to 3D are diagrams showing an example of a method of restoring a defective needle according to the invention

As described above, a restoring method of the invention is a restoring method that is adapted to, when abrasion or fracture of a needle portion of a manipulator provided in an FIB device is confirmed in a microscope image, repair a lost structure of the needle portion with CVD using an FIB or a restoring method that is adapted to, when it is confirmed in a microscope image that the needle portion of the manipulator provided in the FIB device is in a bent state, cut the portion with etching using an FIB and form a normal structure at a tip of the cut portion with the CVD using an FIB to repair the needle portion. In the restoring method, basically, a chipped portion of a needle is repaired in the FIB device itself. In order to solve the problems, in view of points that structures of needle portions are similar in AFM probes, sizes, shapes, and required characteristics and that the needle portions are arranged in the FIB device, the applicant has reached an idea of applying the AFM probe forming method to the needle portions. When a probe of an AFM is created, a cantilever of the AFM has to be carried into the FIB device and set on a sample stage to perform probe portion machining. However, restoration machining for a tip needle portion of a manipulator provided in this FIB device has a great advantage in that the machining can be performed in the FIB device itself that is provided originally.

When work peculiar to the FIB device such as creation of a TEM sample is performed in the FIB device using the manipulator, if abnormality of the manipulator occurs, first, a tip portion of the manipulator is observed using a microscope function provided in the FIB device (in the case of a device including a scanning ion microscope or a scanning electron microscope for observation, the scanning ion microscope or the scanning electron microscope may be used). If the tip portion is in a fractured state due to abrasion or breakage (see FIG. 1A), a needle tip portion is formed anew in the chipped portion by the CVD using an FIB. When hydrocarbon such as phenanthrene is selected as a material gas and sprayed from a gas gun, a needle of a carbon material can be formed. When hexacarbonyleungsten is used, a needle of tungsten can be formed.

If it is found by the microscope observation that the defect is a bend of the tip portion as shown in FIG. 1B, first, a portion from the bent portion to the tip is cut off by sputter etching using an FIB as indicated by a wavy line. Next, a new needle tip portion is formed in the cut portion in the same method as described above. The needle tip of the manipulator is repaired as shown in FIG. 1C. The defect correction described above is also effective for tweezers using needles in a pair. It is possible to restore the tweezers by applying correction to the respective needles. Note that a drive system for the tweezers is not specifically designated.

First Embodiment

Next, an example of a defect repairing method for a tip needle of a manipulator set in a vacuum chamber 1 of an FIB device according to the invention will be described. An auxiliary needle 6, which can replace a needle portion when a defect occurs in the needle portion during work, is created at a corner of a sample surface in advance. Although the needle 6 has a linear shape, for convenience of later work, the needle 6 is formed in a slant direction rather than a vertical direction with respect to the sample surface. In an example shown in FIG. 2A, the needle 6 is formed by a stacking system according to the CVD with the sample surface as a substrate. However, in order to grow a shape in the slant direction, a method of sequentially shifting a position, on which an ion beam is irradiated, in one direction is used. A slant angle increases as the position shifting speed is lowered. A growth direction by the CVD can be set substantially in a directly lateral direction at the maximum, but growth in a downward direction is impossible. In the invention, it is preferable to grow the shape at an angle of about 45°. In an example shown in FIG. 2B, this growth in the slant direction is realized by a slant of the sample surface rather than the shift of an irradiation position of the FIB. In this case, since the irradiation position never changes, the CVD is stacked and formed simply in a beam direction. However, the sample surface to be a substrate is slanted by a tilt function of a sample stage 5, as a result, the needle 6 is planted on the sample surface in a slant state. The needle may be manufactured by the A or B method. The auxiliary needle 6 to be manufactured is not limited to one and plural auxiliary needles 6 may be manufactured.

Figure 3B:
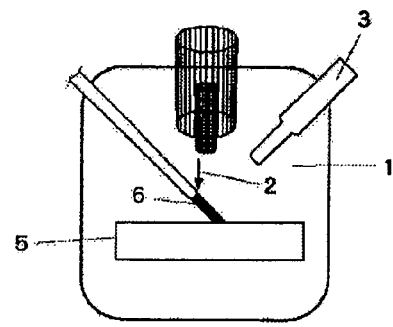
Figure 3C:
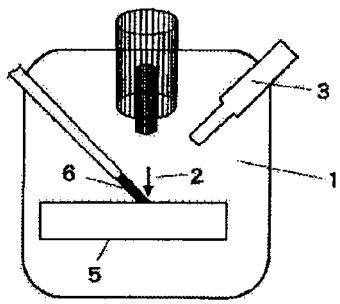
Figure 3D:
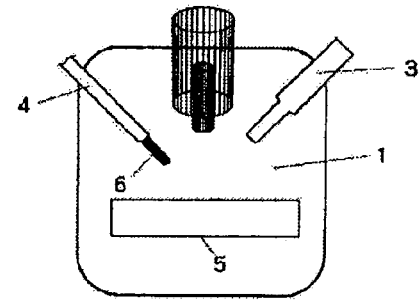

If abnormality of the manipulator 4 occurs during work of the FIB device, the needle portion is observed using the microscope function of the FIB device. When a cause of the abnormality is abrasion or a tip portion fracture such as a breakage defect like the one shown in FIG. 1A, as shown in FIG. 3A, the tip portion is brought close to a tip portion of an auxiliary probe and an FIB 2 is irradiated on the portion while a gas is jetted from a gas gun 3 to join both the tip portions with the CVD as shown in FIG. 3B. If a cause of the abnormality is a bend defect like the one shown in FIG. 1B, the tip portion is cut from the bent portion by FIB sputter etching to remove the tip bent portion and, then, the cut tip portion is brought close to a tip portion of an auxiliary probe to join both the tip portions with the CVD. Subsequent to the joining, as shown in FIG. 3C, the FIB 2 is irradiated on a base of an auxiliary needle to cut off the auxiliary needle 6 from the base with the FIB sputtering etching. According to this process, as shown in FIG. 3D, the auxiliary needle is attached to the fractured tip portion of the manipulator 4 to restore an original needle form.

Note that, although the method of forming an auxiliary needle on a sample surface is described in the embodiment, if the manipulator 4 has a function of directing the needle tip portion in an upward or directly lateral direction, it is also possible to directly apply the CVD machining to the tip portion to restore a shape.

Second Embodiment

Figure 4:
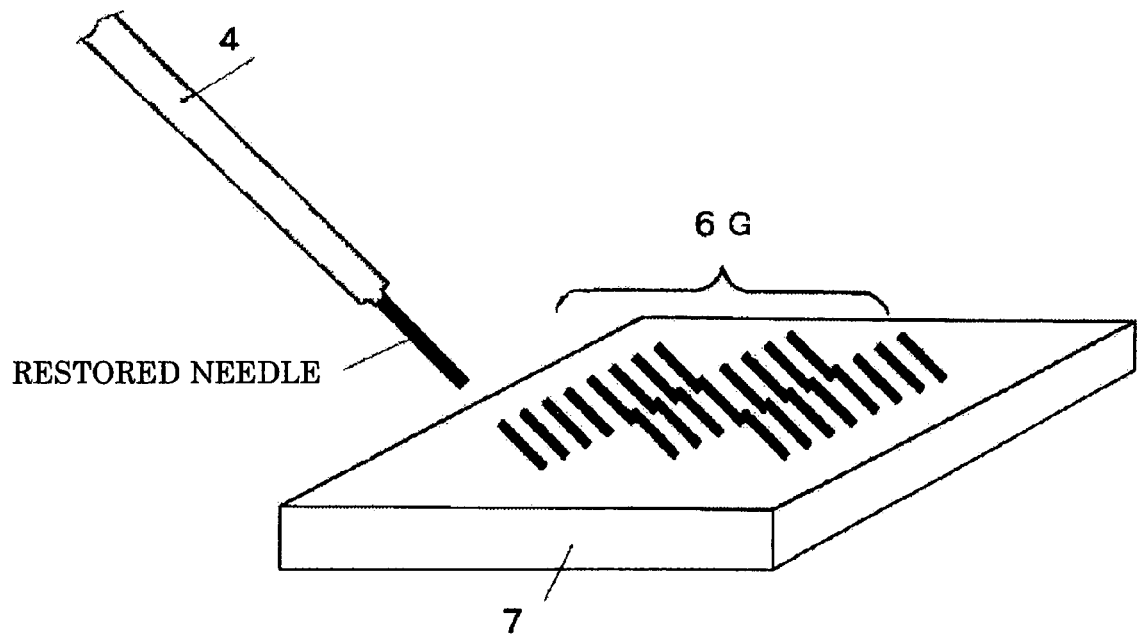
FIG. 4 is a diagram showing a needle member set for replacement of the invention.

Next, a needle member set for replacement will be presented. This is used for making it possible to always stock needles for replacement in the FIB device including this manipulator 4. Instead of manufacturing an auxiliary needle on a sample surface, plural needles planted on an independent substrate 7 in a slanted state are prepared as a set. A manufacturing method may be the method of A or B shown in FIG. 2. As shown in FIG. 4, this needle member set for replacement is a set of a large number of needles planted on the small substrate 7. This set is always stocked in the vacuum chamber 1 of the FIB device or at a corner of the sample stage 5 where the set does not obstruct a sample to be placed to prepare for occurrence of a defect during work of the manipulator 4. If this set is prepared, it is unnecessary to manufacture an auxiliary needle in a sample to be worked every time, and universality of the needle after repair is improved.

Third Embodiment

Figure 5A:
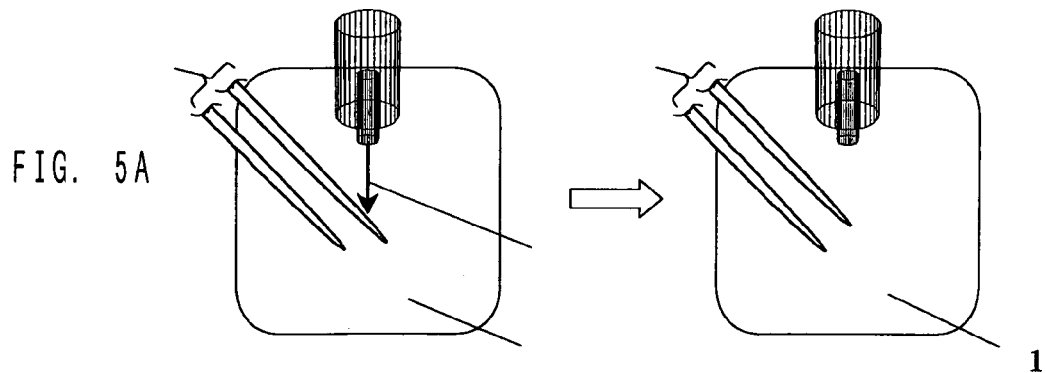
FIG. 5A is a method of etching one needle of defective tweezers to adjust lengths of needles to be the same according to the invention.
Figure 5B:
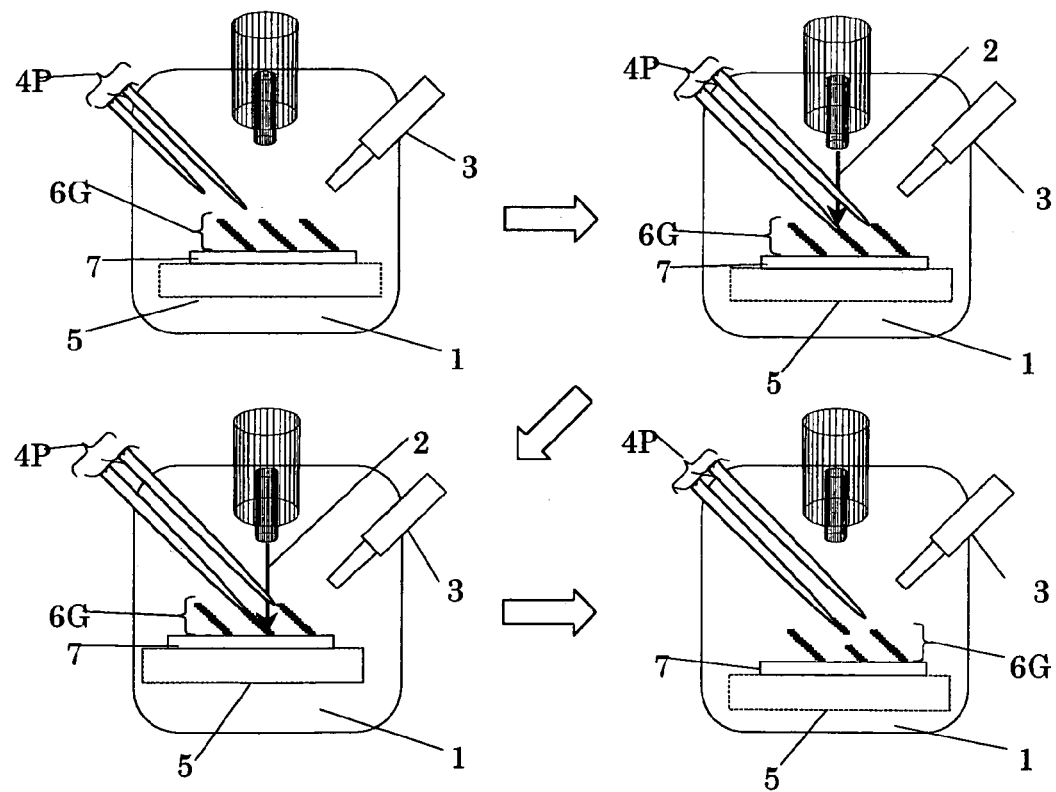
FIG. 5B is a diagram showing an example of a method of connecting an auxiliary needle to one needle of the defective tweezers.
Figure 6:
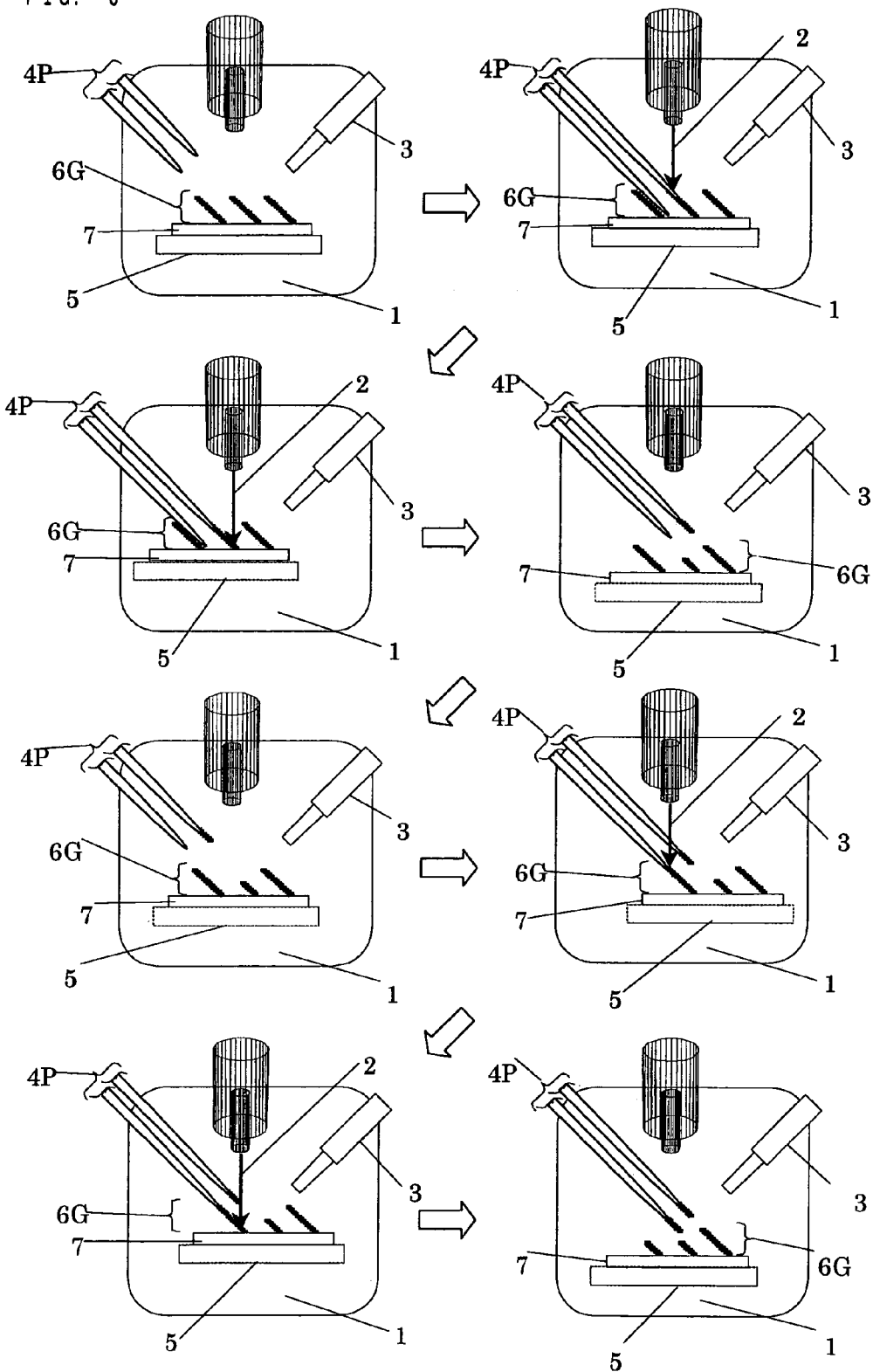
FIG. 6 is a diagram showing an example of a method of restoring tweezers, both needles of which have fractured, to an original length according to the invention.
Figure 9:
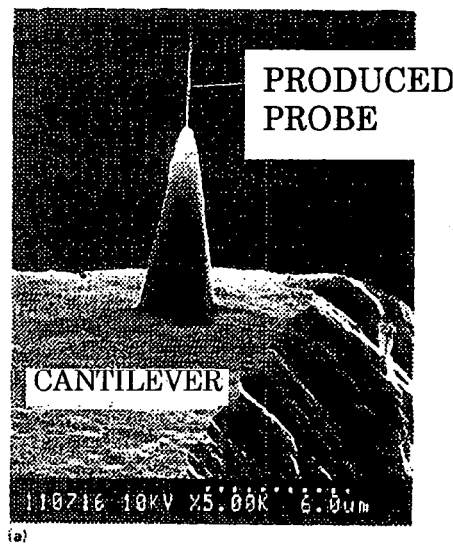
FIG. 9 is a diagram showing an example in which a probe tip portion of an AFM is manufactured by CVD using a focused electron beam.
Figure 9:
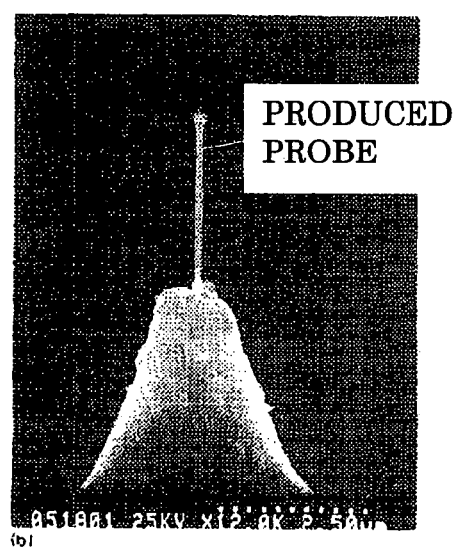

Next, an example of application of the invention to tweezers will be presented. Plural needles for replacement always stocked in the FIB device having a tweezers function at the tip of the manipulator 4 or the plural auxiliary needles 6 planted on the independent substrate 7 in a slanted state are prepared as a set, and the tweezers are repaired in the same manufacturing method as a single needle. Since the tweezers are used with needles of the same length as a pair, when a defect or the like occurs in one of the needles, the tweezers may be reused by adjusting the needles to the same length with etching as shown in FIG. 5A or the tweezers may be used by extending the shorter needle using the method A or B shown in FIG. 2, as shown in FIG. 5B. Moreover, when lengths of both needles are insufficient, as shown in FIG. 6, the tweezers may be reused by extending both needles with the method of A or B shown in FIG. 2. Note that a driving system and a driving direction of the tweezers are not specifically designated.

The restoring method of the invention is a restoring method that is adapted to, when abrasion or fracture of a needle portion of a manipulator provided in an FIB device is confirmed in a microscope image, repair a lost structure of the needle portion with CVD using an FIB or a restoring method that is adapted to, when it is confirmed in a microscope image that the needle portion of the manipulator provided in the FIB device is in a bent state, cut the portion with etching using an FIB and form a normal structure at a tip of the cut portion with the CVD using an FIB to repair the needle portion. Thus, it is possible to immediately repair a deficiency of the needle portion, which occurs during work in a vacuum chamber, and restore the needle portion without taking out the manipulator from the vacuum chamber. In addition, this restoring method is also effective for micro-tweezers functioning as tweezers with needles arranged side by side and held to be used, and repair and restoration for the respective needles are possible. Consequently, compared with the procedure in which it is necessary to release a vacuum state in a chamber, remove an attached manipulator and attach the manipulator in the chamber again after repair, and bring the inside of the chamber into a vacuum state to resume work as in the past, it is possible to reduce time significantly. Moreover, a sample being machine may be lost when the conventional procedure is taken. However, according to the invention, it is possible to resume work directly.

In addition, in the manipulator needle portion restoring method of the invention, a defective portion is repaired by a step of planting plural needles for replacement on the substrate 7 in advance as an auxiliary needle group 6G and joining a needle portion of a manipulator provided in an FIB device in an abrasion or fracture state to a tip portion of the needle for replacement with the CVD using an FIB and a step of cutting a base of the needle for replacement with etching using an FIB. Alternatively, a defective portion is repaired by a step of planting plural needles for replacement on the substrate 7 in advance and cutting a needle portion in a bent state of the manipulator provided in the FIB device with etching using an FIB, a step of joining the cut portion to a tip portion of the needle for replacement with the CVD using an FIB, and a step of cutting a base of the needle for replacement with the etching using an FIB. Thus, since it is possible to use the needles for replacement prepared in advance, time required for repair is further reduced than the method of the invention described above. In addition, in the case of the tweezers in which needles are arranged side by side in a pair and held to be used, if one of the needles has abrasion or fracture, it is possible to repair the fracture or the abrasion according to the same steps. When both the two needles have abrasion or fracture, both the needles are cut to adjust lengths of the needles to be the same by etching using an FIB. If lengths at the time of work are insufficient when the needles are cut to adjust lengths of the needles, it is possible to restore an original length by repairing the defective portion in two sections using respective probes.

The needle member set for replacement of the invention is a set of plural needles planted on a substrate by FIB machining in a slanted state. Thus, if this needle member set is placed in an end area on a sample stage where the set does not obstruct a sample to be placed, it is possible to commonly use the set in work using a manipulator, and it is unnecessary to create auxiliary needles for each sample. Therefore, universality of needles for replacement is improved.

As it is evident from the above explanation, the invention presents the technique for making it possible to machine to restore a defect of a tip needle portion of a manipulator for handing a fine sample or a fine structure, which is set in a vacuum chamber of an FIB device, using an FIB. However, the invention is also applicable to a tip of micro-tweezers including two needles held to be used. In addition, it is also possible to directly apply the invention to an abrasion or breakage defect of a probe in a probe microscope system such as an AFM combined with an FIB device.

What is claimed is:

1. A manipulator needle portion defect repairing method comprising the steps of: confirming the existence of an abrasion or a fracture of a needle portion for holding a sample at an end of a manipulator disposed in an FIB (Focused Ion Beam) device using a microscope function of the FIB device; and repairing the abrasion or the fracture of the needle portion by chemical vapor deposition using a focused ion beam of the FIB device.

2. A manipulator needle portion defect repairing method according to claim 1; wherein the needle portion comprises a needle portion of micro-tweezers.

3. A manipulator needle portion defect repairing method according to claim 1; wherein the manipulator is disposed in a vacuum chamber of the FIB device.

4. A manipulator needle portion defect repairing method, comprising the steps of: confirming the existence of a bent state of a needle portion including a needle tip of a manipulator disposed in an FIB (Focused Ion Beam) device using a microscope function of the FIB device; cutting the bent needle portion including the needle tip by etching using a focused ion beam; and forming a new needle portion including the needle tip of the manipulator by chemical vapor deposition using the focused ion beam of the FIB device to thereby repair needle portion of the manipulator.

5. A manipulator needle portion defect repairing method according to claim 4; wherein the needle portion comprises a needle portion of micro-tweezers.

6. A manipulator needle portion defect repairing method according to claim 4; wherein the manipulator is disposed in a vacuum chamber of the FIB device.

7. A manipulator needle portion defect repairing method, comprising the steps of: confirming a fractured or bent state of a needle portion of at least one of two needles of micro-tweezers using a microscope function of an FIB (Focused Ion Beam) device; and repairing the fractured or bent needle by cutting a tip portion of the needle portion by etching using a focused ion beam of the FIB device to adjust a length of the fractured or bent needle to a length of the other needle of the micro-tweezers.

8. A manipulator needle portion defect repairing method according to claim 7; wherein the confirming step comprises confirming a fractured or bent state of the needle portion of each needle of the micro-tweezers using the microscope function of the FIB device; and wherein the repairing step comprises repairing the fractured or bent needle by cutting a tip portion of each needle portion by etching using the focused ion beam of the FIB device to adjust the lengths of the needles so that the needles have the same length.

9. A manipulator needle portion defect repairing method comprising the steps of: planting a plurality of replacement needles on a substrate in an FIB (Focused Ion Beam) device; joining a needle portion of a manipulator provided in the FIB device in an abrasion or fractured state to an end portion of a preselected one of the replacement needles planted on the substrate by chemical vapor deposition using a focused ion beam of the FIB device; and cutting a base of the preselected replacement needle by etching using the focused ion beam of the FIB device.

10. A manipulator needle portion defect repairing method according to claim 9; wherein the needle portion comprises a needle portion of micro-tweezers; and wherein the replacement needles comprise needles for needle portions of the micro-tweezers.

11. A manipulator needle portion defect repairing method according to claim 9; wherein the joining step comprises the steps of bringing the needle portion of the manipulator close to the end portion of the preselected replacement needle and joining the needle portion of the manipulator provided in the FIB device in an abrasion or fractured state to the end portion of the preselected replacement needle planted on the substrate by chemical vapor deposition using the focused ion beam of the FIB device.

12. A manipulator needle portion defect repairing method comprising the steps of: planting a plurality of replacement needles on a substrate in an FIB (Focused Ion Bean) device; cutting a needle portion of a needle of a manipulator provided in the FIB device by etching using a focused ion beam of the FIB device to remove a bent portion of the needle; joining the cut needle to a tip portion of a preselected one of the replacement needles planted on the substrate by chemical vapor deposition using the focused ion beam of the FIB device; and cutting a base of the preselected replacement needle by etching using the FIB (Focused Ion Bean).

13. A manipulator needle portion defect repairing method according claim 12; wherein the needle portion comprises a needle portion of micro-tweezers; and
 wherein the replacement needles comprise needles for needle portions of the micro-tweezers.

14. A manipulator needle portion defect repairing method according to claim 12; wherein the planting step comprises the step of planting the replacement needles in a surface of the substrate in a slanted state relative to the surface of the substrate.

15. A manipulator needle portion defect repairing method according to claim 12; wherein the planting step comprises the step of growing the replacement needles on a surface of the substrate by chemical vapor deposition so that each of the replacement needles is disposed in a slanted angle relative to the surface of the substrate.

16. A manipulator needle portion defect repairing method according to claim 15; wherein the slanted angle is about 45 degrees.

* * * * *